United States Patent [19]
Chia et al.

[11] Patent Number: 6,081,997
[45] Date of Patent: Jul. 4, 2000

[54] SYSTEM AND METHOD FOR PACKAGING AN INTEGRATED CIRCUIT USING ENCAPSULANT INJECTION

[75] Inventors: Chok J. Chia, Cupertino; Seng Sooi Lim, San Jose; Maniam Alagaratnam, Cupertino, all of Calif.

[73] Assignee: LSI Logic Corporation, Milpitas, Calif.

[21] Appl. No.: 08/911,418

[22] Filed: Aug. 14, 1997

[51] Int. Cl.[7] .................................................. H05K 3/30
[52] U.S. Cl. .............................. 29/841; 29/827; 29/840; 264/272.17; 438/116
[58] Field of Search ............................. 29/840, 841, 827; 438/116; 264/272.17

[56] References Cited

U.S. PATENT DOCUMENTS

| | | | |
|---|---|---|---|
| 4,143,456 | 3/1979 | Inoue | 29/841 |
| 4,766,095 | 8/1988 | Hiroshi . | |
| 5,134,773 | 8/1992 | LeMaire et al. . | |
| 5,218,759 | 6/1993 | Juskey et al. | 29/841 |
| 5,420,752 | 5/1995 | Variot . | |
| 5,450,283 | 9/1995 | Lin et al. . | |
| 5,474,958 | 12/1995 | Djennas et al. | 29/841 |
| 5,692,296 | 12/1997 | Varioit . | |
| 5,732,465 | 3/1998 | Tokita et al. | 29/832 |

*Primary Examiner*—Carl J. Arbes

[57] ABSTRACT

A system and method are presented for forming a grid array device package around an integrated circuit. The integrated circuit includes multiple I/O pads on an underside surface, and an upper surface of a substrate includes a corresponding set of bonding pads. The substrate also has an opening (i.e., a hole) extending therethrough and preferably substantially in the center of the set of bonding pads. Solder bumps formed upon the I/O pads of the integrated circuit are placed in direct contact with corresponding members of the set of bonding pads, then heated until they flow in a C4 connection method. Following C4 connection of the I/O and bonding pads, the substrate and the attached integrated circuit are positioned within a mold cavity formed between two mold sections, and a liquid encapsulant material is injected through the opening of the substrate such that the encapsulant fills the mold cavity. The coupled I/O and bonding pads are enveloped by the liquid encapsulant. The liquid encapsulant is preferably a C4 underfill material. By injecting the liquid encapsulant under pressure, the amount of time required to dispense the liquid encapsulant is reduced as well as the number of voids present in the liquid encapsulant. Following at least partial curing of the encapsulant, the mold sections are separated, and the packaged semiconductor device is removed. When fully cured and hardened, the encapsulant adheres to the adjacent surfaces of the integrated circuit and the substrate, essentially interlocking the surfaces.

21 Claims, 1 Drawing Sheet

SYSTEM AND METHOD FOR PACKAGING AN INTEGRATED CIRCUIT USING ENCAPSULANT INJECTION

BACKGROUND OF THE INVENTION

1. Field of Invention

This invention relates to a semiconductor device package and, more particularly, to a package which is configured to reliably connect an integrated circuit (i.e., chip) to a substrate using encapsulant injected between connection areas which couple the chip to the substrate and further along lateral surfaces of an integrated circuit.

2. Description of Related Art

During manufacture of an integrated circuit (e.g., a microprocessor), signal lines formed upon the silicon substrate which are to be connected to external devices are terminated at flat metal contact regions called input/output (I/O) pads. Following manufacture, the integrated circuit is typically secured within a protective semiconductor device package. Each I/O pad of the chip is then connected to one or more terminals of the device package. The terminals of a device packages are typically arranged about the periphery of the package. Fine metal wires are typically used to connect the I/O pads of the chip to the terminals of the device package. Some types of device packages have terminals called "pins" for insertion into holes in a printed circuit board (PCB). Other types of device packages have terminals called "leads" for attachment to flat metal contact regions on an exposed surface of a PCB.

As integrated circuit fabrication technology improves, manufacturers are able to integrate more and more functions onto single silicon substrates. As the number of functions on a single chip increases, however, the number of signal lines which need to be connected to external devices also increases. The corresponding numbers of required I/O pads and device package terminals increase as well, as do the complexities and costs of the device packages. Constraints of high-volume PCB assembly operations place lower limits on the physical dimensions of and distances between device package terminals. As a result, the areas of peripheral-terminal device packages having hundreds of terminals are largely proportional to the number of terminals. These larger packages with fine-pitch leads are subject to mechanical damage during handling or testing. Mishandling can result in a loss of lead coplanarity, adversely affecting PCB assembly yields. In addition, the lengths of signal lines from chip I/O pads to device package terminals increase with the number of terminals, and the high-frequency electrical performance of larger peripheral-terminal device packages suffer as a result.

Controlled collapse chip connection (C4) is a well known method of attaching an integrated circuit chip directly to a PCB, and is commonly referred to as the "flip chip" method. In preparation for C4 attachment, the I/O pads of the chip are typically arranged in a two-dimensional array upon an underside of the chip, and a corresponding set of bonding pads are formed upon an upper surface of the PCB. A solder "bump" or "ball" is formed upon each of the I/O pads of the chip. During C4 attachment of the chip to the PCB, the solder balls are placed in physical contact with the bonding pads of the PCB. The solder balls are then heated long enough for the solder to flow. When the solder cools, the I/O pads of the chip are electrically and mechanically coupled to the bonding pads of the PCB.

Due to the fact that the silicon of the chip expands at a lower rate than the fiberglass-epoxy laminate of the PCB, the solder balls are subjected to mechanical forces during temperature cycling and eventually fail. As a result, the reliabilities of flip chip solder ball connections are relatively low. This problem of thermomechanical mismatch between the silicon chip and the fiberglass-epoxy laminate PCB is typically solved by filling the region between the chip and the PCB with a liquid polymer adhesive "underfill" material which becomes substantially rigid (i.e., hardens) with curing (e.g., time, temperature, etc.). Once cured, the underfill material essentially interlocks the surfaces of the chip and the PCB surrounding the solder balls, reducing the mechanical forces acting upon the solder balls during temperature cycling. In addition, the underfill material encapsulates the C4 connections, protecting them from contaminants (e.g., moisture, electrically conductive particles, etc.) As a result, the reliabilities of the solder ball connections are substantially increased.

Following solder ball reflow during the C4 process, the underfill material is typically dispensed along one or two sides of the chip. Capillary action is commonly relied upon to draw the liquid underfill material into the region between the chip and the PCB. The PCB and attached chip are typically heated to lower the viscosity of the liquid underfill material, facilitating the dispensing of the underfill material. The PCB may also be tilted at an angle such that the force of gravity helps pull the underfill material into the region between the chip and the PCB.

Although relatively simple, the methods currently relied upon to dispense underfill material have disadvantages. In order to substantially fill the region between the chip and the PCB, the viscosity of the underfill material should be within a certain range. Relying upon capillary action and gravity, the underfill process takes time. Despite close process controls, voids sometimes occur within the underfill material which jeopardize the reliabilities of adjacent solder ball connections. The interlocking of the surfaces of the chip and the PCB surrounding the solder balls by the underfill material relies solely upon the adhesion of the underfill material to surfaces of the PCB and the chip.

Like flip chips, grid array semiconductor device packages have terminals arranged in a two-dimensional array across the underside surface of the device package. As a result, the physical dimensions of grid array device packages having hundreds of terminals are much smaller than their peripheral-terminal counterparts. Such smaller packages are highly desirable in portable device applications such as laptop and palmtop computers and hand-held communications devices such as cellular telephones. In addition, the lengths of signal lines from chip I/O pads to device package terminals are shorter, thus the high-frequency electrical performances of grid array device packages are typically better than those of corresponding peripheral-terminal device packages. Grid array device packages also allow the continued use of existing PCB assembly equipment developed for peripheral-terminal devices.

An increasingly popular type of grid array device package is the ball grid array (BGA) device package. A BGA device includes a chip mounted upon a larger substrate made of, for example, fiberglass-epoxy printed circuit board material or a ceramic material (e.g., aluminum oxide, alumina, $Al_2O_3$, or aluminum nitride, AlN). The substrate includes two sets of bonding pads: a first set adjacent to the chip and a second set arranged in a two-dimensional array across the underside surface of the device package. Members of the second set of bonding pads function as device package terminals, and are coated with solder. The resulting solder balls on the underside of the BGA device package allow the device to be surface mounted upon an ordinary PCB. The I/O pads of the chip are typically connected to corresponding members of the first set of bonding pads by signal lines (e.g., fine metal wires). The substrate includes one or more layers of signal lines (i.e., interconnects) which connect respective members of the first and second sets of bonding pads. During PCB assembly, the BGA device package is attached to the PCB by reflow of the solder balls just as a flip chip is attached to a PCB.

It would be beneficial to have a system and method for packaging an integrated circuit device, wherein the chip is mounted upon a substrate of a grid array semiconductor device package using the C4 or flip chip attachment method, and wherein the underfill material is dispensed by injection. The use of C4 attachment would reduce many of the problems associated with using fine metal wires to connect the I/O pads of the chip to corresponding bonding pads of the BGA package, including wire crossover problems and the added electrical inductances of the wires. Using pressure to inject the underfill material between the chip and the substrate, the amount of time required to dispense the underfill material would be reduced. The number of voids present in the underfill material would also be reduced, resulting in an increase in the reliabilities of the C4 solder ball connections.

SUMMARY OF THE INVENTION

The problems outlined above are in large part solved by a system and method for forming a grid array device package around an integrated circuit. The integrated circuit includes multiple electrical contacts (i.e., I/O pads) on an underside surface, preferably arranged in a two-dimensional array. In one embodiment, the device package includes a substrate having a first set of electrical contacts (i.e., bonding pads) on an upper surface and a second set of bonding pads on an opposed underside surface. The substrate also has an opening (i.e., a hole) extending from the upper surface to the underside surface. The opening is located in close proximity to the first set of bonding pads, and is preferably substantially in the center of the first set of bonding pads. The integrated circuit is mounted upon the upper surface of the substrate using the controlled collapse chip connection (C4) or "flip chip" method described above. Solder bumps formed upon the I/O pads of the integrated circuit are placed in direct contact with corresponding members of the first set of bonding pads, and the solder bumps are heated until they flow. Following connection of the I/O pads of the integrated circuit to corresponding members of the first set of bonding pads, a liquid encapsulant material is injected through the opening of the substrate such that the coupled I/O and bonding pads are enveloped by the liquid encapsulant.

Following connection of the I/O pads of the integrated circuit to corresponding members of the first set of bonding pads of the substrate, the substrate and the attached integrated circuit are positioned within a mold apparatus of the present invention. In one embodiment, the mold apparatus includes a pair of mold sections. A first mold section has an opening extending therethrough, and a second mold section includes a surface having a cavity dimensioned to receive the substrate and the attached integrated circuit. The opening of the first mold section receives a liquid encapsulant delivered by an encapsulant delivery system. The substrate and the attached integrated circuit are positioned between the first and second mold sections that: (i) the opening of the substrate aligns with the opening of the first mold section, and (ii) the substrate and the attached integrated circuit reside within the cavity of the second mold section. A select quantity of the liquid encapsulant is injected under pressure into the cavity of the second mold section. The encapsulant enters the cavity of the second mold section through the aligned openings of the first mold section and the substrate. The encapsulant flows through the coupled I/O pads of the integrated circuit and bonding pads of the substrate and into the remaining portion of the cavity surrounding the integrated circuit. One or more spaces (i.e., air vents) are formed between the second mold section and adjacent portions of the substrate and the first mold section. During injection of the liquid encapsulant into the cavity of the second mold section, the air within the cavity is displaced by the liquid encapsulant, and the displaced air escapes through the one or more air vents.

The liquid encapsulant is preferably a C4 underfill material having a coefficient of thermal expansion (CTE) substantially equal to the CTE of the solder bumps (about 25 ppm/deg. C.). The encapsulant may be, for example, a liquid which becomes substantially rigid (i.e., hardens) when subjected to a curing process. Such a curing process may involve time or elevated temperature. For example, the encapsulant may be an epoxy compound including suspended particles of a thermally conductive and electrically insulating material (e.g., silica). By injecting the liquid encapsulant under pressure, the amount of time required to dispense the liquid encapsulant is reduced. In addition, the number of voids present in the liquid encapsulant is also reduced, resulting in an increase in the reliabilities of the solder bump connections.

Following at least partial curing of the encapsulant, the mold sections are separated, and the packaged semiconductor device is removed. The packaged semiconductor device may then be subjected to additional curing steps. When fully cured and hardened, the encapsulant adheres to the adjacent surfaces of the integrated circuit and the substrate, essentially interlocking the surfaces. The portion of the encapsulant in the region between the upper surface of the substrate and the underside surface of the integrated circuit surrounding the solder bumps reduces the mechanical forces acting upon the solder bumps during temperature cycling, substantially increasing the reliabilities of the solder bump connections. In addition, a portion (i.e., "plug") of the encapsulant remaining within the opening of the substrate provides additional mechanical resistance to lateral movement of the integrated circuit relative to the substrate. It is desirable that the substrate opening have an axis substantially perpendicular to the upper and underside surfaces of the substrate such that the plug is formed during encapsulant injection. Similarly, a portion of the encapsulant surrounding the sides of the integrated circuit also provides additional mechanical resistance to movement of the integrated circuit relative to the substrate. Furthermore, the encapsulant encapsulates the C4 connections between the integrated circuit and the substrate, protecting them from contaminants (e.g., moisture, electrically conductive particles, etc.).

BRIEF DESCRIPTION OF THE DRAWINGS

Other objects and advantages of the invention will become apparent upon reading the following detailed description and upon reference to the accompanying drawings in which.

Figure 1:
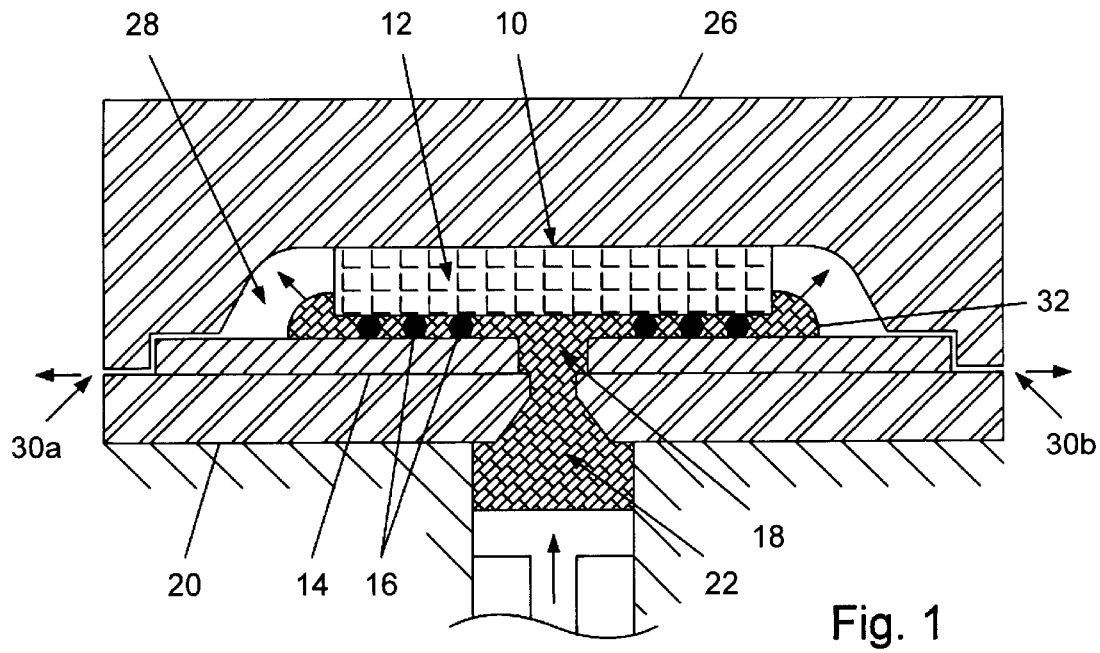
FIG. 1 is a cross-sectional view of one embodiment of a semiconductor device undergoing a packaging process in accordance with the present invention, wherein the semiconductor device includes an integrated circuit (i.e., chip) and a substrate, and wherein solder bumps connect I/O pads of the integrated circuit to corresponding members of a first set of bonding pads of the substrate, and wherein the substrate and attached chip are positioned within a mold cavity formed between two mold sections, and wherein liquid encapsulant is injected under pressure through an opening in the substrate and into the mold cavity, enveloping the coupled I/O and bonding pads.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

FIG. 1 is a cross-sectional view of one embodiment of a semiconductor device 10 undergoing a packaging process in accordance with the present invention. Semiconductor device 10 includes an integrated circuit (i.e., chip) 12 and a substrate 14. Chip 12 includes one or more electronic devices formed upon a monolithic semiconductor substrate. Chip 12 also includes multiple I/O pads on an underside surface which function as device terminals. The I/O pads are preferably arranged in a two-dimensional array and covered with solder, forming solder bumps 16. Substrate 14 is substantially planar and includes a first set of bonding pads on an upper surface and a second set of bonding pads on an opposed underside surface. Members of the first and second sets of bonding pads are preferably arranged in two-dimensional arrays. Members of the first set of bonding pads have substantially the same lateral dimensions (i.e., are approximately the same size) as the I/O pads of chip 12 and are configured to vertically align with the I/O pads of chip 12.

Chip 12 is mounted upon substrate 14 using the controlled collapse chip connection (C4) or "flip chip" method described above. During the C4 mounting process, solder bumps 16 of chip 12 are brought into contact with corresponding members of the first set of bonding pads of substrate 14. Heat is applied to solder bumps 16 to cause them to flow, connecting the I/O pads of chip 12 to the corresponding members of the first set of bonding pads.

Substrate 14 is preferably substantially fiberglass-epoxy printed circuit board material. Alternately, substrate 14 may substantially be, for example, a ceramic material (e.g., aluminum oxide or aluminum nitride). Substrate 14 maintains its substantially planar shape during and after exposure to a maximum C4 temperature of about 230 degrees Celsius.

Substrate 14 includes an opening 18 (i.e., a hole) extending through substrate 14 between the upper and underside surfaces. Opening 18 is in close proximity to the first set of bonding pads, and is preferably located substantially in the center of the first set of bonding pads. Following connection of the I/O pads of chip 12 to corresponding members of the first set of bonding pads of substrate 14, substrate 14 and attached chip 12 are positioned within a mold apparatus of the present invention. The mold apparatus includes a pair of mold sections. The underside surface of substrate 14 is positioned upon a substantially planar upper surface of a first mold section 20 (i.e., a sprue plate) such that opening 18 vertically aligns with a corresponding opening 22 extending through first mold section 20. Opening 22 of first mold section 20 receives a liquid encapsulant 32 delivered by an encapsulant delivery system. A second mold section 26, having a cavity 28 in an underside surface dimensioned to receive substrate 14 and attached chip 12, is positioned directly above first mold section 20 such that substrate 14 and attached chip 20 reside within cavity 28. An upper wall of second mold section 26 preferably contacts an upper surface of chip 12, holding the underside surface of substrate 14 against the upper surface of first mold section 20. One or more spaces (i.e., air vents) are formed between second mold section 26 and adjacent portions of substrate 14 and first mold section 20. In FIG. 1, spaces formed between second mold section 26 and adjacent portions of substrate 14 and first mold section 20 form air vents 30a–b.

A select quantity of liquid encapsulant 32 is injected under pressure through opening 22 of first mold section 20. Liquid encapsulant 32 fills opening 18 of substrate 14, envelopes solder bumps 16 connecting the I/O pads of chip 12 to corresponding members of the first set of bonding pads of substrate 14, and fills cavity 28 of second mold section 26. A portion of cavity 28 adjacent to sides of chip 12 is also filled by liquid encapsulant 32. The air within cavity 28 is displaced by liquid encapsulant 32 and escapes through air vents 30a–b. By injecting liquid encapsulant 32 under pressure, the amount of time required to dispense liquid encapsulant 32 is reduced. In addition, the number of voids present in liquid encapsulant 32 is also reduced, resulting in an increase in the reliabilities of the solder bump 16 connections.

Encapsulant 32 may be, for example, a liquid which becomes substantially rigid (i.e., hardens) when subjected to a curing process. Such a curing process may involve time or elevated temperature. Encapsulant 32 is preferably a C4 underfill material having a coefficient of thermal expansion (CTE) substantially equal to the CTE of solder bumps 16 (about 25 ppm/deg. C.). Encapsulant 32 may be, for example, an epoxy compound including suspended particles of a thermally conductive and electrically insulating material (e.g., silica). A suitable epoxy compound is Dexter HYSOL® No. 4527, a silica-filled epoxy (Dexter Electronic Materials, Industry, Calif.).

Figure 2:
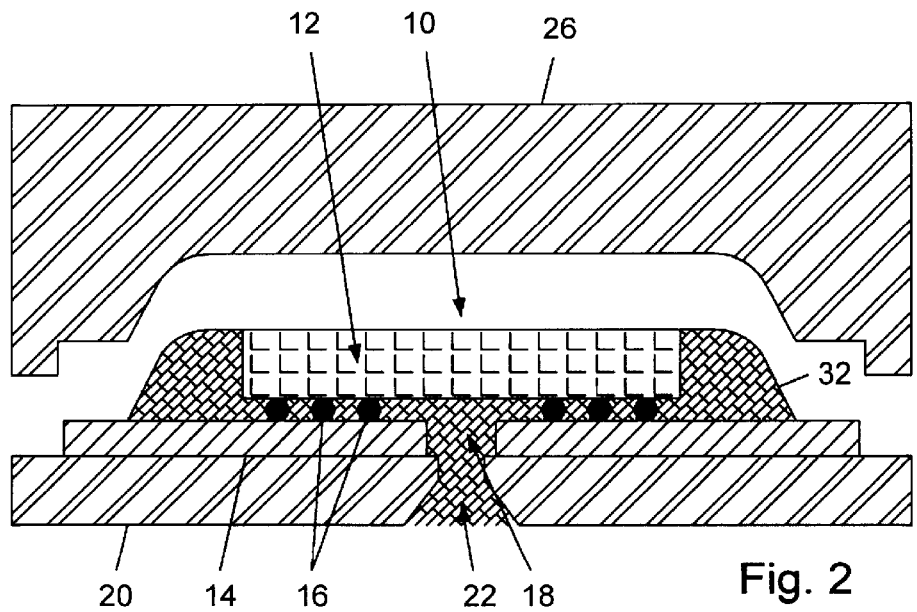
FIG. 2 is a cross-sectional view of the semiconductor device of FIG. 1 following at least partial curing of the encapsulant and separation of the mold sections.

FIG. 2 is a cross-sectional view of semiconductor device 10 following at least partial curing of encapsulant 32 and separation of first mold section 20 and second mold section 26. Following removal from first mold section 20 and second mold section 26, additional curing may be performed upon semiconductor device 10 in order to completely harden encapsulant 32. When fully cured and hardened, encapsulant 32 adheres to the adjacent surfaces of chip 12 and substrate 14, essentially interlocking the surfaces. The portion of encapsulant 32 in the region between the upper surface of substrate 14 and the underside surface of chip 12 surrounding solder bumps 16 reduces the mechanical forces acting upon solder bumps 16 during temperature cycling, substantially increasing the reliabilities of the solder bump 16 connections. A portion of cured encapsulant 32 fills opening 22 of first mold section 20 and opening 18 of substrate 14, forming a "plug" of cured encapsulant 32. The plug is substantially brittle, and pulling substrate 14 away from first mold section 20 breaks the plug along the interface between the underside surface of substrate 14 and the upper surface of first mold section 20, separating substrate 14 from first mold section 20. A portion of the plug remains within opening 18 of substrate 14 and provides additional mechanical resistance to lateral movement of chip 12 relative to substrate 14. Similarly, a portion of encapsulant 32 surrounding the sides of chip 12 also provides additional mechanical resistance to movement of chip 12 relative to substrate 14. Furthermore, encapsulant 32 encapsulates the C4 connections between chip 12 and substrate 14, protecting them from contaminants (e.g., moisture, electrically conductive particles, etc.).

Figure 3:
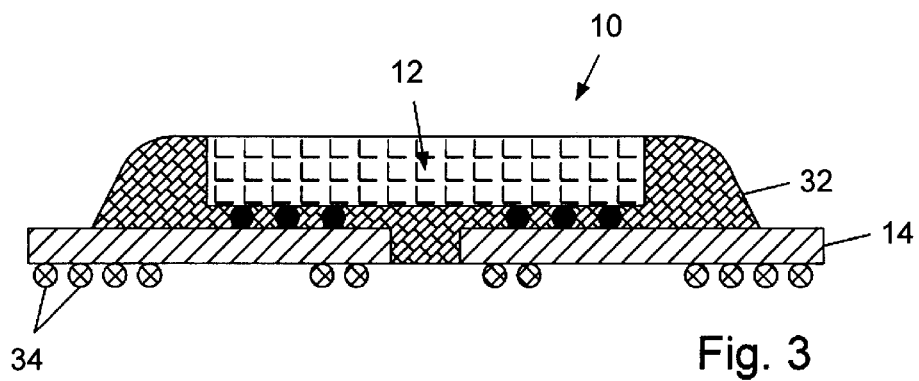
FIG. 3 is a cross-sectional view of the semiconductor device of FIG. 2 following full curing of the encapsulant and the covering of a second set of bonding pads on the underside surface of the substrate with solder, forming solder balls which function as terminals of the semiconductor device.

FIG. 3 is a cross-sectional view of semiconductor device 10 following full curing of encapsulant 32 and the covering of the second set of bonding pads on the underside surface of substrate 14 with solder, forming solder balls 34 which function as terminals of semiconductor device 10. Substrate 14 includes one or more patterned horizontal layers of electrically conductive material forming electrical conductors connecting members of the first and second sets of bonding pads. A layer of the dielectric material of substrate 14 (i.e., fiberglass-epoxy or ceramic material) separates adjacent horizontal conductive layers, electrically isolating the conductive layers. As is common practice, horizontal trace conductors connect members of the first and second bonding pads with the help of vertical conductive vias.

It is noted that the second set of bonding pads on the underside of substrate 14 may have pins extending outwardly therefrom for connecting to a PCB or for inserting into a socket. Accordingly, first mold section 20 may have openings (e.g., cavities or holes) positioned and dimensioned to receive the pins.

Numerous variations and modifications will become apparent to those skilled in the art once the above disclosure is fully appreciated. It is intended that the following claims be interpreted to embrace all such variations and modifications.

What is claimed is:

1. A method for packaging an integrated circuit, comprising:

mounting the integrated circuit on a substrate comprising a plurality of bonding pads, such that the bonding pads are soldered to respective input/output (I/O) pads on a surface of the integrated circuit;

positioning the mounted integrated circuit within a mold, wherein the mold comprises a mold opening aligned with a substrate opening formed through the substrate; and injecting an encapsulant through the mold and substrate openings such that a cavity bounded by the mold and laterally surrounding the integrated circuit is substantially filled with the encapsulant.

2. The method as recited in claim 1, wherein said positioning and injecting comprise:

placing the integrated circuit and substrate within the cavity in the mold; and introducing a liquid encapsulant through the mold and substrate openings such that the coupled bonding and I/O pads are enveloped by the liquid encapsulant.

3. The method as recited in claim 1, wherein the substrate opening is substantially in the center of the plurality of bonding pads.

4. The method as recited in claim 1, wherein said injecting further comprises injecting the encapsulant under pressure.

5. The method as recited in claim 1, wherein the surface of the substrate is substantially parallel to the surface of the integrated circuit when bonded together, and wherein the substrate opening and the mold opening extend along a common axis perpendicular to the surfaces of the substrate and integrated circuit.

6. The method as recited in claim 1, wherein a select quantity of the liquid encapsulant is introduced through the opening of the first mold section.

7. The method as recited in claim 1, wherein the mold comprises two sections.

8. The method as recited in claim 1, wherein the liquid encapsulant comprises thermally conductive and electrically insulating particles.

9. The method as recited in claim 1, wherein the liquid encapsulant comprises a silica-filled epoxy.

10. The method as recited in claim 1, wherein said mounting further comprises attaching solder bumps between I/O pads on the underside of the integrated circuit and respective bonding pads on the upper surface of the substrate, using a controlled collapse chip connection technique.

11. The method as recited in claim 1, wherein said substrate comprises fiberglass-epoxy printed circuit board material.

12. The method as recited in claim 1, wherein said substrate comprises a ceramic material, such as aluminum oxide or aluminum nitride.

13. The method as recited in claim 1, further comprising forming solder bumps on the surface of the substrate opposite the one to which the integrated circuit is mounted, and wherein, subsequent to encapsulation, said solder bumps may function as terminals of the integrated circuit and may be used to attach the integrated circuit to a printed circuit board.

14. The method as recited in claim 1, further comprising attaching mounting pins to the bonding pads on the surface of the substrate opposite the one to which the integrated circuit is mounted, and wherein, subsequent to encapsulation, said mounting pins may function as terminals of the integrated circuit and may be used to insert the integrated circuit into a socket.

15. A system of encapsulation, comprising:

a first mold section comprising an opening adapted for alignment with a passage through a substrate upon which the integrated circuit is mounted via a plurality of electrical connections;

a second mold section adapted to fit over the integrated circuit and substrate when the substrate is placed upon and in alignment with the first mold section;

a mechanism adapted for positioning the integrated circuit and substrate between the first mold section and the second mold section; and a mechanism adapted for injecting liquid encapsulant through the opening to the plurality of electrical connections.

16. The system as recited in claim 15, wherein said mechanism for injecting liquid encapsulant substantially fills interstices among the plurality of electrical connections with said encapsulant.

17. The system as recited in claim 15, wherein said cavity is dimensioned to receive the integrated circuit and substrate a lateral spaced distance from the integrated circuit such that the liquid encapsulant extends around the perimeter of the integrated circuit an amount substantially equal to said lateral spaced distance.

18. The system as recited in claim 15, wherein the liquid encapsulant injected through the opening displaces air from the region between the first and second mold sections.

19. The system as recited in claim 18, wherein during use a venting space exists between the first and second mold sections, and wherein the displaced air escapes through the space.

20. The system as recited in claim 15, wherein the integrated circuit is mounted upon the substrate such that a surface of the integrated circuit populated with I/O pads faces and is substantially parallel to a surface of the substrate correspondingly populated with bonding pads.

21. The system as recited in claim 20, wherein said mounting of the integrated circuit upon the substrate is achieved by means of solder bumps between at least one of the I/O pads of the integrated circuit and corresponding bonding pads of the substrate.

* * * * *